United States Patent [19]

Obata

[11] Patent Number: 4,920,515
[45] Date of Patent: Apr. 24, 1990

[54] PROGRAMMABLE LOGIC ARRAY HAVING AN IMPROVED TESTING ARRANGEMENT

[75] Inventor: Takeo Obata, Osaka, Japan

[73] Assignee: Ricoh Company, Ltd., Tokyo, Japan

[21] Appl. No.: 259,884

[22] Filed: Oct. 19, 1988

[30] Foreign Application Priority Data

Oct. 23, 1987 [JP] Japan .................. 62-268840

[51] Int. Cl.$^5$ ............... G11C 7/00; H03K 19/173
[52] U.S. Cl. ............... 365/189.08; 365/185; 365/201; 365/189.03; 307/465; 307/468; 340/825.91
[58] Field of Search ............ 365/189.08, 185, 201, 365/189.03; 307/465, 468; 340/825.83, 825.91; 364/716

[56] References Cited

U.S. PATENT DOCUMENTS

| 4,525,714 | 6/1985 | Still et al. ............... | 307/465 |
| 4,617,649 | 10/1986 | Kyomasu et al. ............... | 365/185 |
| 4,780,628 | 10/1988 | Illman ............... | 307/465 |

FOREIGN PATENT DOCUMENTS 0126322 11/1984 European Pat. Off. ............ 307/465

OTHER PUBLICATIONS

Grassl, "A Self Testing PLA", IEEE ISSCC Digest of Technical Papers, Feb. 10, 1982, pp. 60–61.

*Primary Examiner*—Glenn A. Gossage
*Attorney, Agent, or Firm*—Cooper & Dunham

[57] ABSTRACT

A programmable logic array (PLA) whose AC characteristics such as an input-to-output delay characteristic can be measured includes a plurality of input lines, a plurality of product term lines, a plurality of non-volatile memory elements, and a test input line to which a test signal may be applied. Those non-volatile memory elements which are connected to the input lines other than the test input line are turned OFF in a test mode, while turning all product term lines other than the product term line whose AC characteristics are to be measured, to a low level. Only those memory elements whose AC characteristics are to be measured are operable in an ON-OFF fashion and only the product term line to be measured is ready to have a low level or a high level. When a test signal is applied to the test input line, it is routed to the operable memory elements and product term line only.

3 Claims, 4 Drawing Sheets

PROGRAMMABLE LOGIC ARRAY HAVING AN IMPROVED TESTING ARRANGEMENT

BACKGROUND OF THE INVENTION

The present invention relates to a programmable logic array having an AC testing circuit.

Programmable logic arrays (hereinafter referred to as PLAs) known in the art may be typified by an AND and fixed-OR type PLA. This type of PLA includes, for example, three input terminals and input lines which are individually connected to the input terminals. Other input lines are individually connected to the input terminals via inverters. Two product term lines are each connected to a DC power source via an exclusive pull-up resistor. Twelve floating MOS FETs (hereinafter referred to as FAMOSes), for example, are each connected at a drain thereof to a product term lines, at a gate thereof to an input line, and at a source thereof to ground. An OR gate is connected at its output terminal to an output terminal of the PLA. Sense amplifiers are each connected between a respective one of the product term lines and a respective one of the input terminals of the OR gate. Further, two N-channel MOS FETs (hereinafter referred to as NMOSFETs) for selecting the product term lines are each connected at a drain thereof to a program circuit, at a gate thereof to a Y decoder, and at a source thereof to a respective one of the product term lines.

With a PLA having the above construction, the logic of a PLA AND array is defined by selectively programming the various FAMOSes i.e., by maintaining particular FAMOSes in a constant OFF state, as is well known in the art. With the resulting AND array logic, the PLA performs predetermined operations with signals appearing on the respective input terminals and produces the result of these operations via the output terminal.

A problem with the prior art PLA is as follows. For example, in an initial condition of such a PLA immediately after the fabrication, none of the FAMOSes has been programmed. When a signal having a high level or a low level is applied to the input terminals of the PLA, the FAMOSes connected to the product term lines become ON. Hence, the product term lines are constantly maintained at ground potential, i.e. low level. It is impossible, therefore, to measure an input-to-output delay characteristic and other AC characteristics of the PLA by applying a periodic pulse signal, for example, to the input terminals.

SUMMARY OF THE INVENTION

It is therefore an object of the present invention to provide a PLA whose AC characteristics such as an input-to-output delay characteristic can be measured while FAMOSes or similar non-volatile volatile memories of the PLA are not programmed.

A programmable logic array having an AND array of the present invention comprises a plurality of input lines, a plurality of product term lines, a plurality of non-volatile memory elements interposed between the input lines and the product term lines, a test input for inputting a test signal, and a control circuit for, in a test mode for measuring AC characteristics of the programmable logic array, turning OFF the non-volatile memory elements which are connected to the input lines other than the test input line and turning the product term line other than the product term line with which the AC characteristics are to be measured to a low level.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 1:
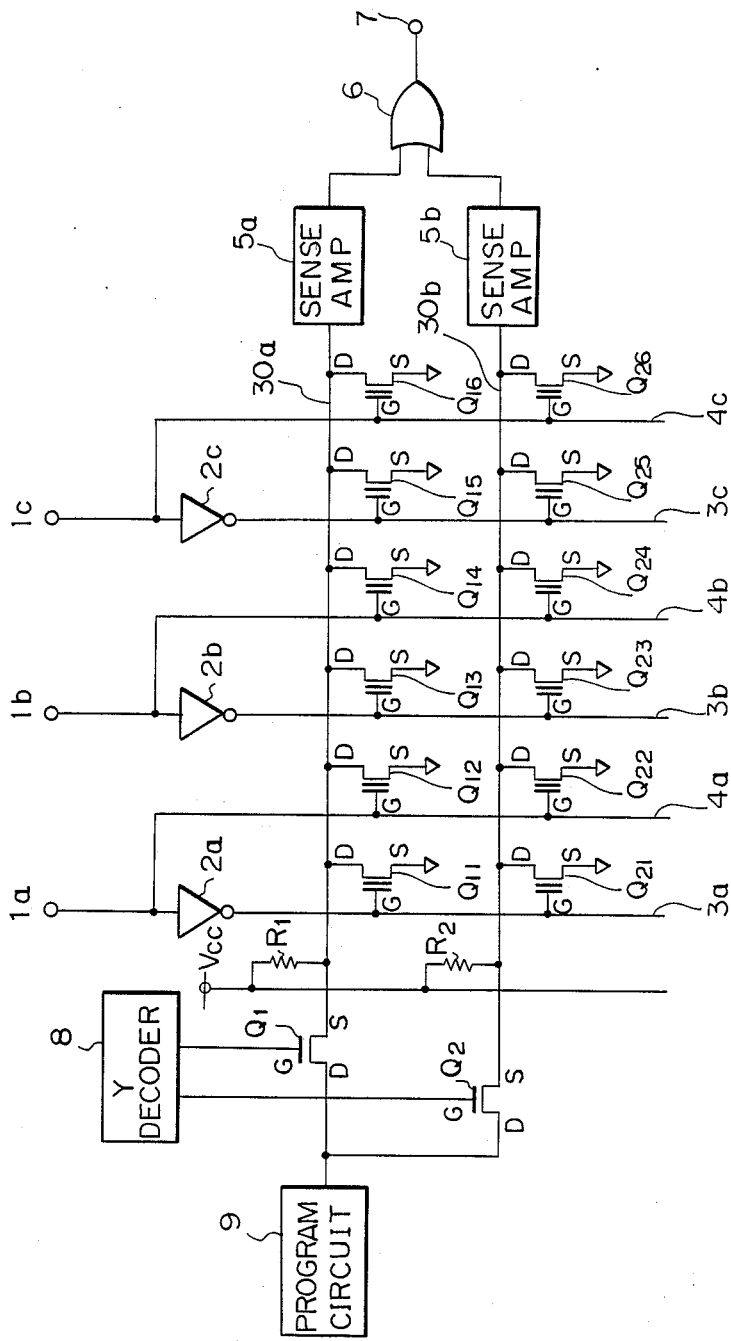
FIG. 1 is a circuit diagram representative of a prior art PLA.

To better understand the present invention, a brief reference will be made to a prior art PLA, shown in FIG. 1. In the figure, the PLA is an AND and fixed-OR type PLA representative of a family of PLAs heretofore proposed in the art. The prior art PLA includes input terminals 1a, 1b and 1c which are respectively connected to input lines 4a, 4b and 4c and, via inverters 2a, 2b and 2c, to input lines 3a, 3b and 3c. FAMOSes Q11 and Q21 included in the AND array of the PLA are connected at their gates to the input line 3a. Gates of FAMOSs Q12 and Q22 are connected to the input line 4a, while gates of FAMOSes Q13 and Q23 are connected to the input line 3b. Gates of FAMOSes Q14 and Q24 are connected to the input line 4b, gates of the FAMOSes Q15 and Q25 are connected to the input line 3c, and gates of FAMOSes Q16 and Q26 are connected to the input line 4c. Drains of the FAMOSes Q11 to Q16 are connected to a product term line 30a which is in turn connected via a sense amplifier 5a to a first input terminal of an OR gate 6 which is included in an OR array of the PLA. Drains of the FAMOSes Q21 to Q26 are connected to a product term line 30b which is in turn connected via a sense amplifier 5b to a second input terminal of the OR gate 6. The output terminal of the OR gate 6 is connected to an output terminal 7 of the PLA. The product term lines 30a and 30b are connected to a +5 volt DC power source Vcc, for example, via pull-up resistors R1 and R2, respectively, to be pulled up thereby. The product term line 30a is connected to a program circuit 9 by way of a source and a drain of an N-channel MOS FET (NMOSFET) Q1 which is adapted to select a product term line. The product term line 30b is connected to the program circuit 9 via a source and a drain of an NMOSFET Q2 which is also adapted to select a product term line. Gates of the NMOSFETs Q1 and Q2 are connected to a Y decoder 8.

As is well known in the art, the logic of a PLA AND array is defined by selectively programming the FAMOSes Q11 to Q16 and Q21 to Q26, i.e., by selectively maintaining them in a constant OFF state. With the resulting AND array logic, the PLA performs predetermined operations with input signals and produces the result of these operations via the output terminal 7. In the case where the FAMOSes Q11 to Q16 and Q21 to Q26 are to be programmed, a high level signal is applied from the Y decoder 8 to the gate of the NMOSFET Q1 or Q2 to turn it ON. This selects one of the product term lines 30a and 30b which is connected to the drain of a FAMOS to be programmed. Thereupon, the program circuit 9 applies a +15 volt program voltage, for example, to the particular product term line 30a or 30b selected by way of the drain and source of the NMOSFET Q1 or Q2 while applying a +15 volt program voltage, for example, to the particular input line which is connected to the gate of the FAMOS to be programmed. In this manner, any desired one of the FAMOSes can be programmed.

However, the prior art PLA having the above construction suffers from the following drawback. For example, in an initial condition of such a PLA immediately after the fabrication, none of the FAMOSes has been programmed. When a signal having a high level or a low level is applied the input terminals of the PLA, the FAMOSes connected to the product term lines become ON. Hence, the product term lines are constantly maintained at ground potential, i.e. low level. It is impossible, therefore, to measure an input-to-output delay characteristic and other AC characteristics of the PLA by applying a periodic pulse signal, for example, to the input terminals, as discussed earlier.

Figure 2:
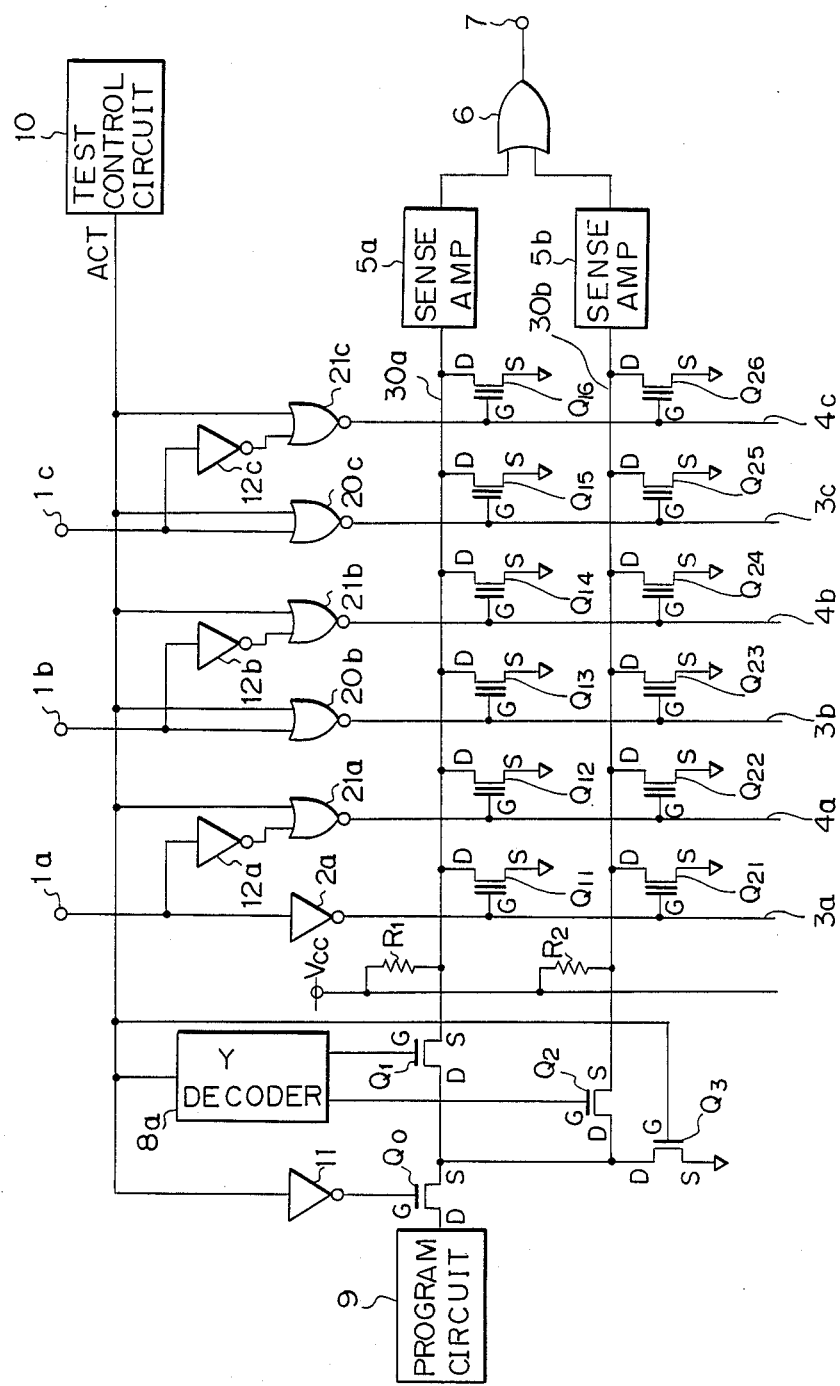
FIG. 2 is a circuit diagram showing the PLA embodying the present invention.

Referring to FIG. 2, a PLA embodying the present invention is shown which eliminates the drawback discussed above. In the figure, the same or similar structural elements as those shown in FIG. 1 are designated by the same reference numerals. Generally, the features which distinguish the PLA of FIG. 2 from the PLA of FIG. 1 are as follows:

(1) A test control circuit 10 is provided for outputting a high level set signal ACT which conditions the PLA for a test mode. The inverters 2b and 2c shown in FIG. 1 are replaced with three inverters 12a, 12b and 12c and five NOR gates 20b, 20c, 21a, 21b and 21c which are individually controlled by the test control signal ACT to disable input lines 4a, 4b, 4c, 3b and 3c (in practice to turn them to a low level) with respect to signals which appear on input terminals 1a, 1b and 1c;

(2) The Y decoder 8 of FIG. 1 is replaced with a Y decoder 8a which is controlled by the test control signal ACT;

(3) A switching NMOSFET Q0 is interposed between the drains of NMOSFETs Q1 and Q2 and the program circuit 9 for selectively disconnecting the program circuit 9 from the product term lines 30a and 30b. The NMOSFET Q0 is controlled by the test control signal ACT via an inverter 11; and (4) A switching NMOSFET Q3 is provided for turning the product term line 30a or 30b to ground potential, i.e., low level under the control of the test control signal ACT.

Such characteristic features of the embodiment shown in FIG. 2 will be described in detail hereinafter.

In the PLA of FIG. 2, FAMOSes Q11 to Q16 and Q21 to Q26, sense amplifiers 5a and 5b, OR gate 6, pull-up resistors R1 and R2 and NMOSFETs Q1 and Q2 are constructed and arranged in the same manner as those shown in FIG. 1. The test control circuit 10 produces a low level test control signal ACT in a logical operation mode and a program mode and produces a high level test control signal ACT in a test mode. The logical operation mode and the program mode are used to execute ordinary logical operations of the PLA and to program the FAMOSes, respectively. The test control signal ACT is routed to the Y decoder 8a, a gate of the NMOSFET Q3, and a second input terminal of each of NOR gates 20b, 20c, 21a, 21b and 21c while being applied to a gate of the NMOSFET Q0 via the inverter 11. The input terminal 1a is connected to a first input terminal of the NOR gate 21a via the inverter 12a. The input terminal 1b is connected to a first input terminal of the NOR gate 20b and, via the inverter 12b, to a first input terminal of the NOR gate 21b. Further, the input terminal 1c is connected to a first input terminal of the NOR gate 20c and, via the inverter 12c, to a first input terminal of the NOR gate 21c. Drains of the NMOSFETs Q1 and Q2 are connected to a drain of the NMOSFET Q3 while a source of the NMOSFET Q3 is connected to ground.

With the PLA having the above construction, a test mode operation is executed immediately after the fabrication of the PLA or when all the FAMOSes are initialized, i.e., before the FAMOSes are programmed. In the test mode, the test control circuit 10 outputs a test control signal ACT having a high level. This signal ACT is fed to the gate of the NMOSFET Q0 via the inverter 11 to make the NMOSFET non-conductive (OFF). In this condition, the program circuit 9 is disconnected from the product term lines 30a and 30b and the high level test control signal ACT is fed to the Y decoder 8a. In response, the Y decoder 8a delivers a high level signal to the gate of the NMOSFET Q1 or Q2 which is associated with the product term line 30a or 30b which is not to be tested, whereby that NMOSFET Q1 or Q2 is turned ON. Consequently, one of the product terminal lines 30a and 30b is selected and connected to the drain of the NMOSFET Q3. Further, the high level test control signal ACT is applied to the gate of the NMOSFET Q3 to turn it ON with the result that the product term line 30a or 30b selected by the Y decoder 8a is turned to a low level. Since such a test control signal ACT is also applied to the second input terminals of the NOR gates 20b, 20c, 21a, 21b and 21c, the input lines 3b, 3c, 4a, 4b and 4c connected to the output terminals of those NOR gates are constantly held at a low level.

Assume that the NMOSFET Q2 is turned ON in order to test the product term line 30a by way of example. When a periodic pulse signal which periodically has a low level and a high level, for example, is applied to the input terminal 1a, the FAMOS Q11 is periodically turned ON and OFF to in turn periodically change the logical level of the product term line 30a between the high level and the low level. The resulting signal whose level changes periodically as mentioned is delivered to the output terminal 7 of the PLA via the sense amplifier 5a and OR gate 6. In this manner, when the product term line 30a or 30b not to be tested is turned to a low level and a test signal in the form of periodic pulses, for example, is applied to the input terminal 1a, the test signal appears on the output terminal 7 of the PLA via, product term line 30a or 30b, sense amplifier 5a or 5b, and OR gate 6. Hence, it is possible to measure an input-to-output delay characteristic and other AC characteristics of the PLA over a relatively long signal line extending between the input terminal 1a and the output terminal 7, i.e. an input line and a product term line. Also, it is possible to test the switching behavior of the FAMOSes Q11 and Q21 which are connected to the input line 3a.

In both the logical operation mode and the program mode, the test control circuit 10 produces a test control signal ACT having a low level. At this time, the test control signal ACT enables the NOR gates 20b, 20c, 21a, 21b and 21c, turns ON the NMOSFET Q0, and turns OFF the NMOSFET Q3. The Y decoder 8a recognizes the logical operation mode or the program mode being set up and operates in the same manner as in the prior art PLA. Hence, in the logical operation mode and the program mode, the PLA shown in FIG. 2 is equivalent in circuitry to the prior art PLA of FIG. 1 and therefore similar in operation to the latter.

Figure 3:
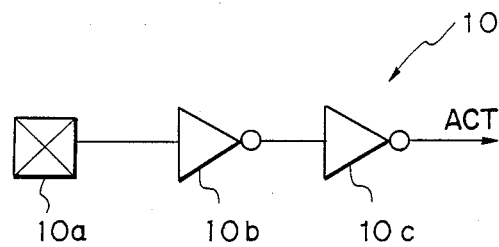
FIGS. 3 and 4 are circuit diagrams each showing a different specific construction of a test control circuit which is included in the PLA of FIG. 1.
Figure 4:
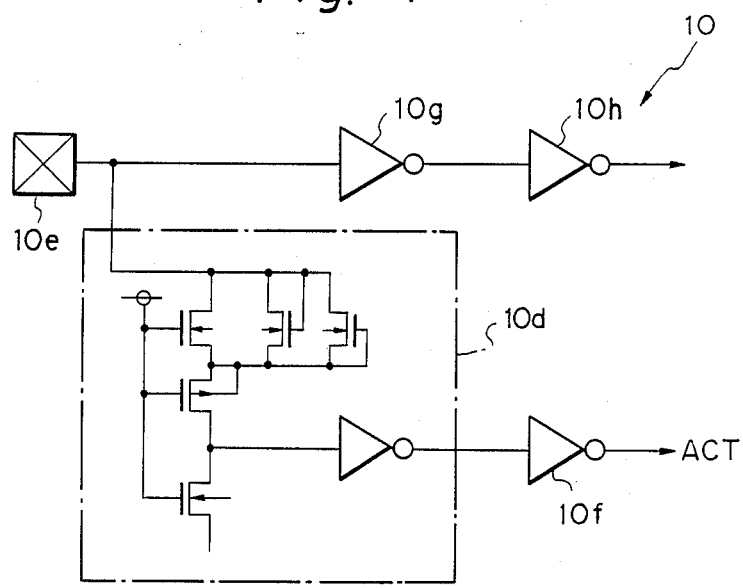

Referring to FIG. 3, a specific construction of the test control circuit 10 is shown. As shown, the test control circuit 10 includes a test mode select terminal 10a to which a high level signal and a low level signal are applied in the test mode and in the modes other than the test mode, respectively. Such a signal is routed through inverters 10b and 10c to become the test control signal ACT. FIG. 4 shows an alternative construction of the test control circuit 10 which includes a high voltage detecting circuit 10d and a particular terminal 10e. A high voltage (e.g. 10 volts) is applied to the terminal 10e in the test mode, and a low voltage such as 0 volt to 5 volts is applied to the terminal 10e in the other modes. The high voltage detecting circuit 10d produces the test control signal ACT via the inverter 10f. An input signal appearing on the terminal 10e is routed through inverters 10g and 10h.

Figure 5:
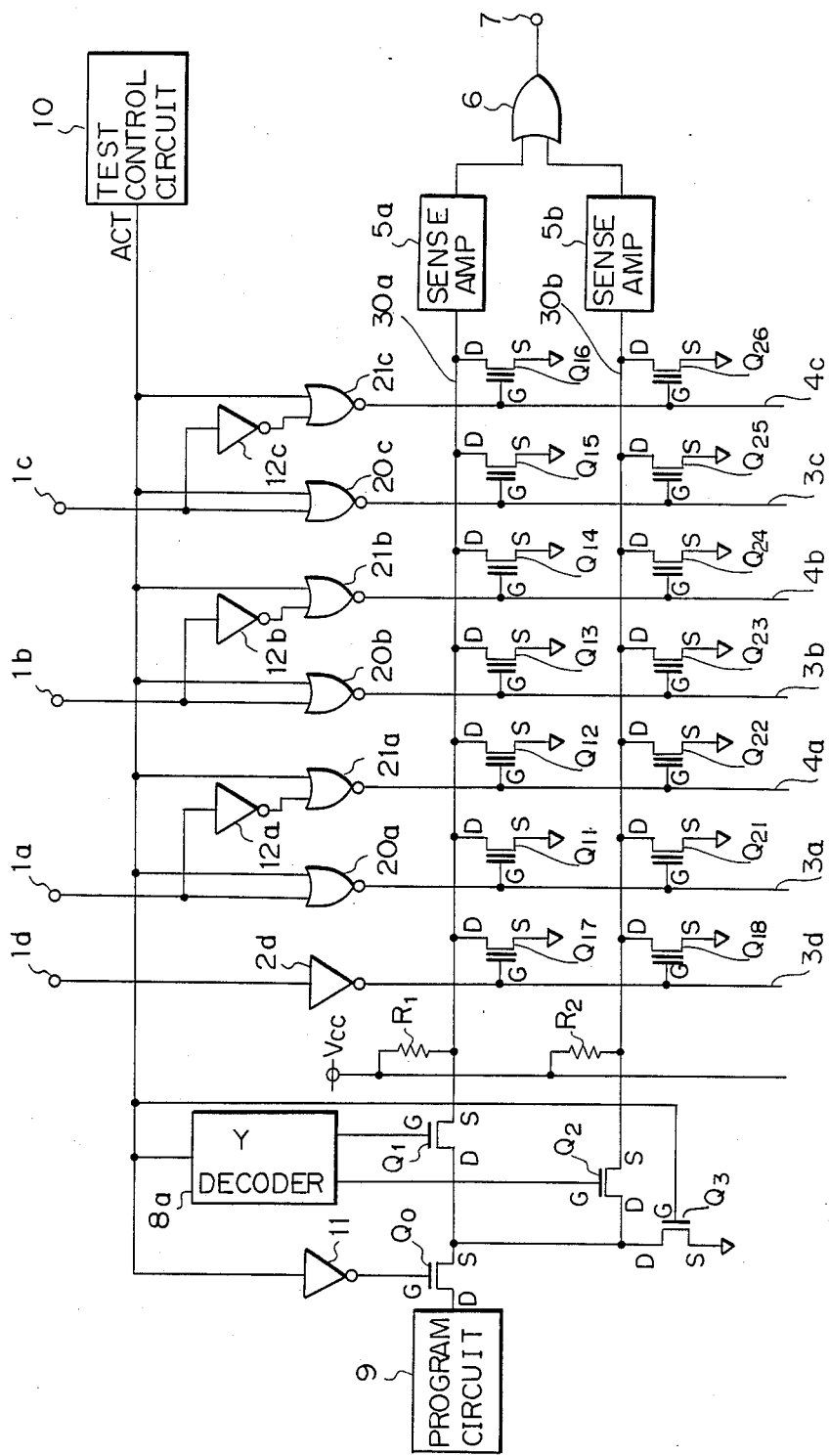
FIG. 5 is a circuit diagram showing an alternative embodiment of the present invention.

Referring to FIG. 5, an alternative embodiment of the present invention is shown. In the figure, the same or similar structural elements as those shown in FIGS. 1 and 2 are designated by like reference numerals. The embodiment of FIG. 5 is different from the embodiment of FIG. 2 in the following respects:

(1) A NOR gate 20a is substituted for the inverter 2a of FIG. 2;

(2) An exclusive input terminal 1d for testing is connected to an input line 3d adapted for testing via an inverter 2d; and (3) Extra FAMOSes Q17 and Q18 are provided.

In detail, as shown in FIG. 5, the input terminal 1a is connected to a first input terminal of the NOR gate 20a while a test control signal ACT from the test control circuit 10 is applied to a second input terminal of the NOR gate 20a. The output terminal of the NOR gate 20a is connected to the input line 3a. The exclusive test input terminal 1d is connected to the test input line 3d via the inverter 2d. Gates of the FAMOSes Q17 and Q18 are connected to the input line 3d while their sources are connected to ground. Drains of the FAMOSes Q17 and Q18 are connected to the product term lines 30a and 30b, respectively. The operation of the PLA shown in FIG. 5 is essentially the same as that of the PLA shown in FIG. 2 except that the input terminal 1d is exclusively assigned to the test signal ACT and the input line 3a, too, becomes a low level in the test mode. It is to be noted that the test control circuit shown in any of FIGS. 3 and 4 is also applicable to the PLA of FIG. 5.

In summary, a PLA in accordance with the present invention includes control means for turning off those non-volatile memory elements which are connected to input lines other than a test input line in a test mode and which is adapted to measure AC characteristics of the PLA while turning all product term lines other than the product term line whose AC characteristics are to be measured to a low level. The PLA is therefore capable of turning OFF those non-volatile memory elements through which a test signal does not flow and preventing such particular memory elements from becoming ON. Since the product term line not to measure the AC characteristics is maintained at a low level, it is possible to measure the AC characteristics of the PLA such as an input-to-output delay characteristic with the non-volatile memory elements being not programmed.

Various modifications will become possible for those skilled in the art after receiving the teachings of the present disclosure without departing from the scope thereof. For example, FAMOSes implementing a PLA as shown and described may be replaced with read only memory elements which are electrically erasable and rewritable (EEPROMs), fuse melt type memory elements, or ultraviolet ray erasable read only memory elements (EPROMs) by way of example.

What is claimed is:

1. A programmable logic array having an AND array, comprising:

a plurality of input lines ($1a$–$1c$);

a plurality of product term lines ($30a$, $30b$);

a plurality of non-volatile memory elements ($Q_{11}$–$Q_{16}$, $Q_{21}$–$Q_{26}$) respectively interposed between said input lines and said product term lines;

a test line ($1d$) for inputting a test signal, and test elements ($Q_{17}$, $Q_{18}$) respectively interposed between said test line and said product term lines; and control means for, in a test mode for measuring AC characteristics of said programmable logic array, turning OFF those non-volatile memory elements which are connected to said input lines other than said test input line and setting to a low level all product term lines other than said product term line whose AC characteristics are to be measured to a low level, said means selectively applying to said test line a test signal causing said test elements to selectively alternate setting to a high level and a low level the product line whose AC characteristics are to be measured;

said programmable logic array including a program circuit (9), a gate transistor $Q_0$ through which said program circuit is coupled to said product term lines, line selection transistors ($Q_1$, $Q_2$) interposed in respective product term lines between the point at which the product term lines are coupled with said program circuit through said gate transistor and the points at which the product term lines are coupled with said non-volatile elements, a decoder (8a) coupled with said line selection transistors to control their OFF/ON states, and a pull-up transistor ($Q_3$) coupled to said product term lines at points thereof which are between said gate transistor and said line selection transistors to selectively set respective lines to a low level.

2. A programmable logic array as claimed in claim 1, wherein said test signal causes said test elements to periodically set to a low level said product line whose AC characteristics are to be measured.

3. A programmable logic array as claimed in claim 1, wherein each of said non-volatile memory elements comprises a FAMOS transistor.

* * * * *